United States Patent
Stella et al.

(10) Patent No.: US 9,012,787 B2
(45) Date of Patent: Apr. 21, 2015

(54) ELECTRONIC SYSTEM FOR WAVE SOLDERING

(71) Applicant: STMicroelectronics S.r.l., Agrate Brianza (IT)

(72) Inventors: Cristiano Gianluca Stella, San Gregorio Di Catania (IT); Rosalba Cacciola, Tremestrieri Etneo (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 240 days.

(21) Appl. No.: 13/626,229

(22) Filed: Sep. 25, 2012

(65) Prior Publication Data
US 2013/0083490 A1    Apr. 4, 2013

(30) Foreign Application Priority Data
Sep. 30, 2011 (IT) .............................. MI2011A1777

(51) Int. Cl.
| H05K 1/16 | (2006.01) |
|---|---|
| H05K 3/34 | (2006.01) |
| H05K 1/11 | (2006.01) |
| H05K 3/30 | (2006.01) |

(52) U.S. Cl.
CPC .............. *H05K 3/3468* (2013.01); *H05K 1/111* (2013.01); *H05K 3/305* (2013.01); *H05K 2201/09381* (2013.01); *H05K 2201/09472* (2013.01); *H05K 2201/09745* (2013.01); *H05K 2203/044* (2013.01); *H01L 2224/73203* (2013.01)

(58) Field of Classification Search
USPC ................. 174/260, 255, 258, 259, 261, 262; 257/98, 690, 737, 777, 778; 438/106, 438/107, 108; 385/14; 361/760, 783; 362/241

See application file for complete search history.

(56) References Cited

U.S. PATENT DOCUMENTS

| 4,413,309 | A  |    | 11/1983 | Takahashi et al. |
|---|---|---|---|---|
| 4,893,216 | A  |    | 1/1990  | Hagner |
| 6,148,512 | A  | *  | 11/2000 | Brown .............................. 29/837 |
| 6,172,422 | B1 | *  | 1/2001  | Chigawa et al. ............... 257/778 |
| 6,208,525 | B1 | *  | 3/2001  | Imasu et al. ................... 361/783 |
| 6,461,896 | B1 | *  | 10/2002 | Imasu et al. ................... 438/108 |
| 7,783,141 | B2 | *  | 8/2010  | Kodama et al. .................. 385/14 |
| 2001/0002162 | A1 | * | 5/2001 | Imasu et al. ................... 361/783 |
| 2001/0002163 | A1 | * | 5/2001 | Imasu et al. ................... 361/783 |
| 2002/0060904 | A1 | * | 5/2002 | Higuchi ......................... 361/760 |
| 2002/0192865 | A1 | * | 12/2002 | Imasu et al. ................... 438/108 |
| 2002/0195718 | A1 | * | 12/2002 | Imasu et al. ................... 257/778 |

(Continued)

FOREIGN PATENT DOCUMENTS

GB    2047973 A1    12/1980

OTHER PUBLICATIONS

Italian Search Report and Written Opinion mailed May 31, 2012 for IT MI2011A001777 (7 pages).

*Primary Examiner* — Xiaoliang Chen
(74) *Attorney, Agent, or Firm* — Gardere Wynne Sewell LLP (57) ABSTRACT

An electronic board includes conducting traces having an upper surface at least partially sunken with respect to a gluing surface of the board. A surface mount technology electronic device for mounting to the board includes insulating windows that define gluing sites within one or more pins. An electronic system is formed by one or more of such surface mount technology electronic devices mounted to electronic board. The devices are attached using a wave soldering technique that flows through channels formed by the sunken conductive traces.

15 Claims, 8 Drawing Sheets

(56) References Cited

U.S. PATENT DOCUMENTS

| | | | |
|---|---|---|---|
| 2003/0080409 A1* | 5/2003 | Nakamura et al. | 257/700 |
| 2004/0012958 A1* | 1/2004 | Hashimoto et al. | 362/241 |
| 2005/0104205 A1* | 5/2005 | Wang | 257/730 |
| 2006/0030071 A1* | 2/2006 | Mizukoshi et al. | 438/106 |
| 2006/0170112 A1* | 8/2006 | Tanaka et al. | 257/777 |
| 2006/0231950 A1* | 10/2006 | Yoon | 257/737 |
| 2007/0037418 A1* | 2/2007 | Akram et al. | 439/82 |
| 2008/0088018 A1* | 4/2008 | Yoon | 257/738 |
| 2008/0170819 A1* | 7/2008 | Kodama et al. | 385/14 |
| 2008/0247703 A1* | 10/2008 | Kodama et al. | 385/14 |
| 2009/0020874 A1* | 1/2009 | Watanabe et al. | 257/737 |
| 2009/0053459 A1* | 2/2009 | Hirose et al. | 428/76 |
| 2009/0154131 A1* | 6/2009 | Hirose et al. | 361/803 |
| 2009/0176331 A1* | 7/2009 | Mizukoshi et al. | 438/107 |
| 2009/0181497 A1* | 7/2009 | Mizukoshi et al. | 438/108 |
| 2009/0212412 A1* | 8/2009 | Yoon | 257/690 |
| 2009/0272569 A1* | 11/2009 | Wischnat | 174/262 |
| 2009/0314537 A1* | 12/2009 | Hirose et al. | 174/263 |
| 2010/0032200 A1* | 2/2010 | Hirose et al. | 174/261 |
| 2010/0071945 A1* | 3/2010 | Hori | 174/260 |
| 2010/0133688 A1* | 6/2010 | Shigihara et al. | 257/738 |
| 2010/0187556 A1* | 7/2010 | Kim et al. | 257/98 |
| 2010/0200898 A1* | 8/2010 | Lin et al. | 257/294 |
| 2011/0156248 A1* | 6/2011 | Matsuki | 257/737 |
| 2012/0032329 A1* | 2/2012 | Shigihara et al. | 257/738 |
| 2012/0126429 A1* | 5/2012 | Do et al. | 257/777 |
| 2012/0326337 A1* | 12/2012 | Camacho et al. | 257/782 |

* cited by examiner

ELECTRONIC SYSTEM FOR WAVE SOLDERING

PRIORITY CLAIM

This application claims priority from Italian Application for Patent No. MI2011A001777 filed Sep. 30, 2011, the disclosure of which is hereby incorporated by reference.

TECHNICAL FIELD

The solution according to one or more embodiments refers to the field of electronics. In more detail, the solution according to one or more embodiments relates to wave soldering.

BACKGROUND

Several assembly processes for manufacturing electronic systems are widespread in the art for large-scale production. Basically, each assembly process provides for mounting one or more electronic devices onto an electronic board (e.g., a Printed Circuit Board or PCB). Generally, each electronic device comprises a chip (or more) of semiconductor material on which an actual electronic component is integrated. The chip is enclosed in a package of insulating material in order to be insulated and protected from the outside environment. The package exposes conducting pins, which are coupled with corresponding terminals of the conducting chip. The pins are soldered to conducting tracks formed on the electronic board. This allows the interaction between the electronic component, comprised in the electronic device, and other electronic devices mounted on the electronic board in a similar way, through the conducting tracks properly connected to one another.

The soldering between the pins of the electronic devices and the tracks of the electronic board should be performed homogeneously for ensuring proper operation and/or performance of the electronic system. At the same time, the soldering should ensure a stable mechanical connection between the electronic devices and the electronic board.

For example, a known soldering technique is the wave soldering technique. In this case, the electronic devices are initially glued onto the electronic board by means of an adhesive paste, at conducting traces being precursor of the tracks of the electronic board. Subsequently, the assembly thus obtained is placed over a bath of molten solder paste, with a gluing surface of the electronic board (on which the electronic devices are glued) facing downward. The assembly is then flooded with a wave of molten solder paste, which laps the electronic board in such a way to bind to the conducting traces of the electronic board and to the pins of the electronic devices. In this way, the corresponding conducting tracks that create an electrical and mechanical coupling between the electronic devices and the electronic board are formed.

The wave soldering technique described above, however, may be troublesome with certain types of electronic devices. For example, this may occur in the case of Surface Mounting Technology or SMT electronic devices having pins substantially exposed on a mounting surface of the electronic device on the electronic board—known in the art as "No-Lead" or "Micro-lead"—especially if of small size.

In fact, a gap between the pins and the conducting traces may be too narrow for allowing the wave of solder paste to enter it in an optimal way—in particular, in the case of pins with a relatively large area. Furthermore, the electronic devices may be positioned with the mounting surface being not perfectly parallel to the electronic board due to a reduced number and/or a sub-optimal distribution of sites for dispensing the most common adhesive pastes on the mounting surface of the electronic devices. Indeed, the miniaturization of the electronic device accordingly reduces its mounting surface, while the size of the pins remains substantially unchanged for ensuring the same current density, thereby reducing the available space on the mounting surface for the gluing sites—for example, no longer available in some perimeter locations thereof. Therefore, due to such an imperfect positioning of the electronic devices on the electronic board, during the wave soldering the solder paste may be distributed unevenly. For these reasons it may occur that the coupling between the pins and the conducting tracks may be not formed in a satisfactory manner or may not be formed at all. The electronic system thus assembled would have reduced performance and working life, down to be completely unable to operate.

SUMMARY

In general terms, the solution according to one or more embodiments is aimed at improving the wave soldering.

In particular, one or more aspects of the solution according to specific embodiments are set out in the independent claims, with advantageous features of the same solution that are set out in the dependent claims, whose wording is herein incorporated verbatim by reference (with any advantageous features provided with reference to a specific aspect of the solution according to an embodiment that apply mutatis mutandis at any other aspect thereof).

More specifically, an aspect of a solution according to an embodiment provides an electronic board with conducting traces at least partially sunken.

Another aspect of a solution according to an embodiment provides a corresponding process for manufacturing an electronic system.

Another aspect of a solution according to an embodiment provides an electronic device of the surface mounting technology with insulating windows that define glueing sites within one or more pins.

Another aspect of a solution according to an embodiment provides an electronic system comprising an electronic board and one or more of such electronic devices.

BRIEF DESCRIPTION OF THE DRAWINGS

A solution according to one or more embodiments, as well as additional features and its advantages will be better understood with reference to the following detailed description of an embodiment thereof, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated and/or simplified) and that, unless otherwise specified, they are simply intended to conceptually illustrate the structures and procedures described herein. In particular.

DETAILED DESCRIPTION OF THE DRAWINGS

Figure 1A:
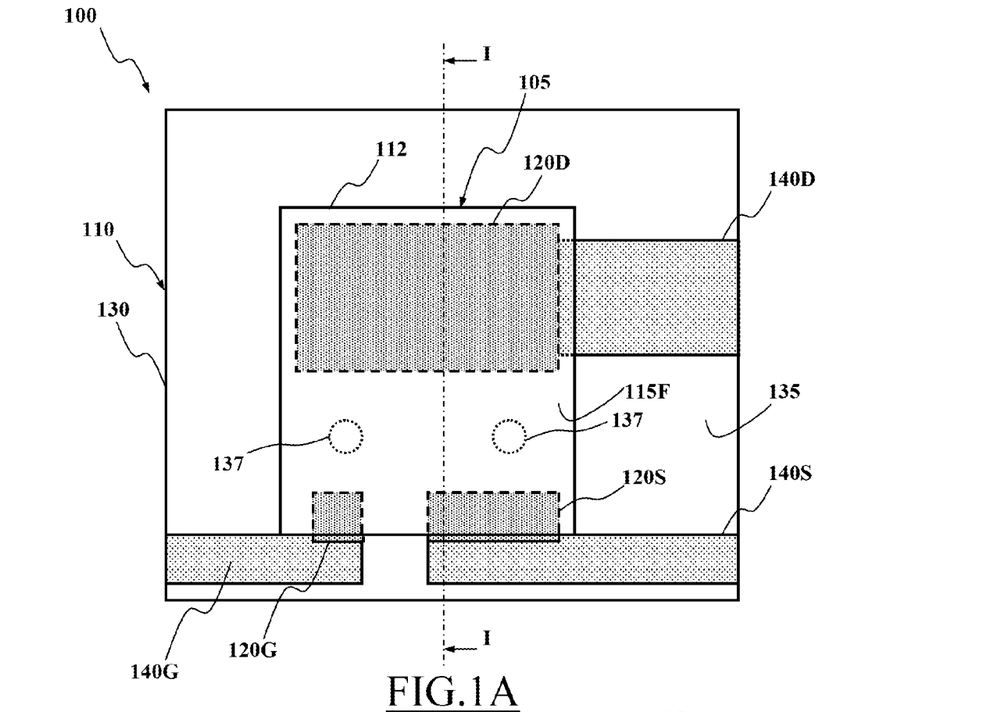
FIG. 1A illustrates a schematic plan view of a portion of an electronic system known in the art.
Figure 1B:
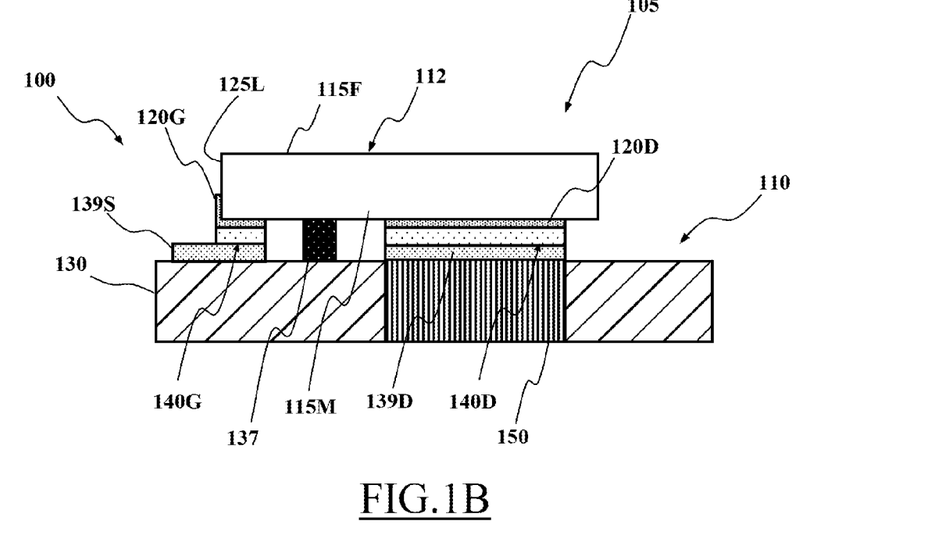
FIG. 1B illustrates a schematic cross-sectional view according to plan I-I of the electronic system of FIG. 1A.

With particular reference to FIGS. 1A and 1B together, they illustrate a schematic plan view and a schematic cross-sectional side view according to plane I-I, respectively, of a portion of an electronic system 100 known in the art.

In more detail, the electronic system 100 comprises an electronic device 105 mounted on an electronic board 110.

In the example at issue, the electronic device 105 is of the No-Lead (or Micro-Lead) SMT type. In particular, the electronic device 105 comprises a package 112 made of an insulating material (e.g., plastic or ceramic); the package 112 is substantially parallelepiped-shaped with two main surfaces, i.e., a mounting surface 115M (for mounting on the electronic board 110) and a free surface 115F opposed thereto. The package 112 houses a chip (or more) of semiconductor material within it, not visible in the figures, on which an electronic component is integrated—from a single element, e.g., a transistor, to a complete circuit, e.g., a central processing unit.

In order to provide an electrical path between the plate and elements external to the electronic device 105—thereby allowing connecting the electronic component to other electronic components, not shown in the figures—the package 112 comprises a plurality of conducting pins, such as a source pin 120S, a gate pin 120G and a drain pin 120D in the example at issue; each of the pins 120S, 120G, 120D is electrically connected to corresponding terminals of the chip (e.g., by connecting wires, or "wire bonding" in the jargon, comprised within the package 112, not shown in the figures). For example, the pin 120D is connected to a drain terminal, the pin 120S is connected to a source terminal and the pin 120G is connected to a gate terminal of a power MOS transistor integrated in the chip.

The pins 120S, 120G are generally rectangular-shaped, and extend partially on the mounting surface 115M and partially on a side surface 125L of the package 112. Conversely, the pin 120D is fully exposed on the mounting surface 115M with a generally rectangular shape, and covers about half of the mounting surface 115M; the pin 120D also acts as a heat sink for transferring (in operation) the heat from the chip, mounted thereon, to the electronic board 110.

The electronic board 110 consists of a PCB having an insulating substrate 130 formed in an insulating material (e.g., FR-4 comprising fiberglass and epoxy resin), for supporting the electronic device 105 (and possibly other electronic devices not shown in figures). The substrate 130 is provided with a gluing surface 135, on which the electronic device 105 is glued by means of an adhesive paste 137 placed in two gluing sites between the pins 120S, 120G and the pin 120D. On the gluing surface 135 a plurality of conducting traces in conducting material are formed (e.g., copper Cu), which conducting traces have enlarged portions for the pins 120G, 120S, 120D; each pin 120G, 120S, 120D is wave-soldered to the corresponding enlarged portion of the conducting traces, in order to obtain conducting tracks with pads (at their enlarged portions) that create an electrical and mechanical coupling between the electronic device 105 and the electronic board 110. In the example at issue, a gate track (not shown in the figure), a source track 139S and a drain track 139D for the pin 120G, the pin 120S and the pin 120D, respectively, are formed, from which a gate track 140G, a source track 140S and a drain track 140D, respectively, are obtained.

In addition, at the enlarged portion of the track 139D there is also possible to form through holes that pass through the electronic board 110 and then to fill them with metal material (e.g., with the same process used to form the traces 139G, 139S, 139D). In this way, a thermal path element (thermal via) 150 is made, which allows transmitting the heat dissipated by the pin 120D to the outside more efficiently.

Figure 2A:
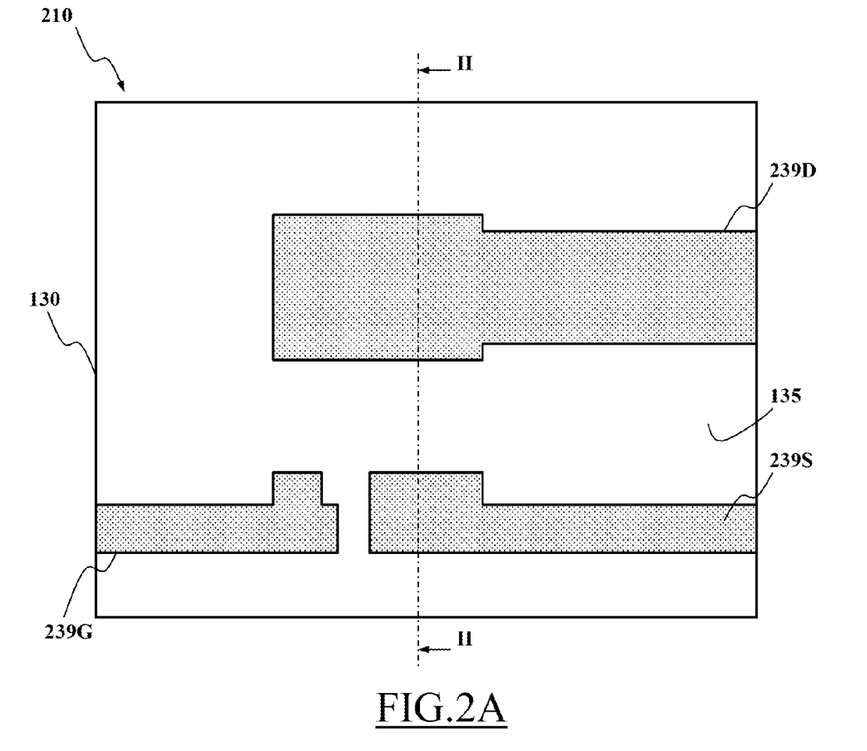
FIG. 2A illustrates a schematic plan view of a portion of an electronic board according to an embodiment.
Figure 2B:
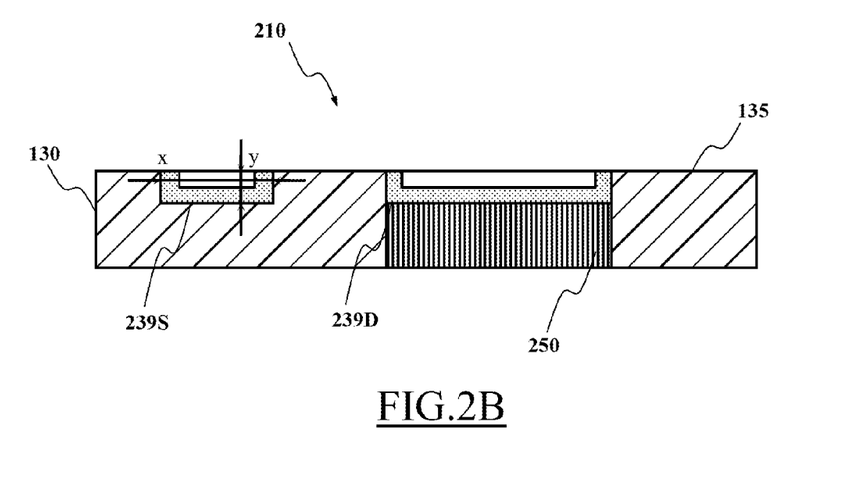
FIG. 2B illustrates a schematic side view according to plan II-II of the portion of the electronic board of FIG. 2A.

Considering now FIGS. 2A and 2B together, they illustrate a schematic plan view and a schematic cross-section side view with respect to the plane II-II, respectively, of an electronic board 210 according an embodiment.

The electronic board 210 differs from the known electronic board previously described as follows.

In this case, the gate, source and drain traces (indicated by the references 239G, 239S and 239D, respectively) are (at least in part) sunken in the substrate 130 from the gluing surface 135. Particularly, the traces 239G, 239S, 239D are placed at a depth y (between a free upper surface thereof and the gluing surface 135). This depth y is determined according to operating parameters of the specific wave soldering for which the electronic board 210 is designed, such as a viscosity of the corresponding solder paste, a speed of the wave of solder paste and a desired final thickness of the solder joints between the electronic board 210 and the corresponding electronic devices. Preferably, although without limitation, the depth y of the traces 239G, 239S, 239D will be selected lower than 80 μm to ensure good mechanical and electrical reliability; for example the depth y will be comprised between 20 μm and 70 μm, preferably between 30 μm and 60 μm, and still more preferably between 30 μm and 50 μm (e.g., equal to 40 μm). For example, such result is achieved by etching the substrate 130 on the gluing surface 135 by means of any known technique (e.g., by means of photo-lithography and chemical etching or by means of a mechanical process), and depositing a layer of metallic material in such etchings (both on the bottom and laterally) by means of any known technique (e.g., via an electroplating process). Therefore, the thermal via beneath the trace 239D (indicated by the reference 250) is narrowed accordingly (with its height substantially reduced by the quantity y).

In addition, the trace 239G may also be formed so as to extend beyond the gate pad toward the trace 239S (to facilitate its reaching by the wave solder paste from the track 239S).

Figure 3A:
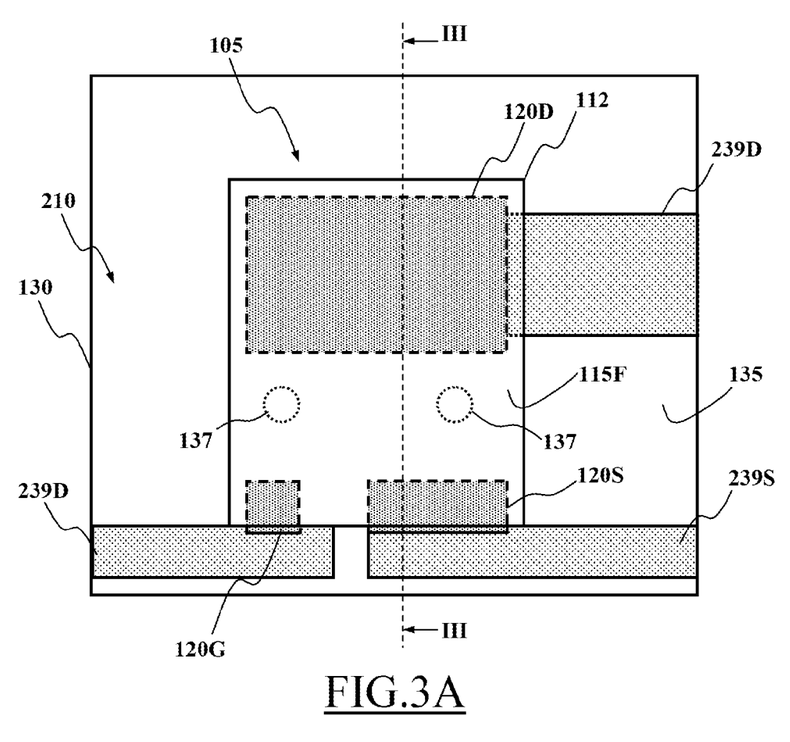
FIG. 3A, FIG. 3B, FIG. 4 and FIG. 5 illustrate the various phases of a process for manufacturing an electronic system according to an embodiment, in which an electronic device known in the art is mounted on the electronic board of FIGS. 2A-2B.
Figure 3B:
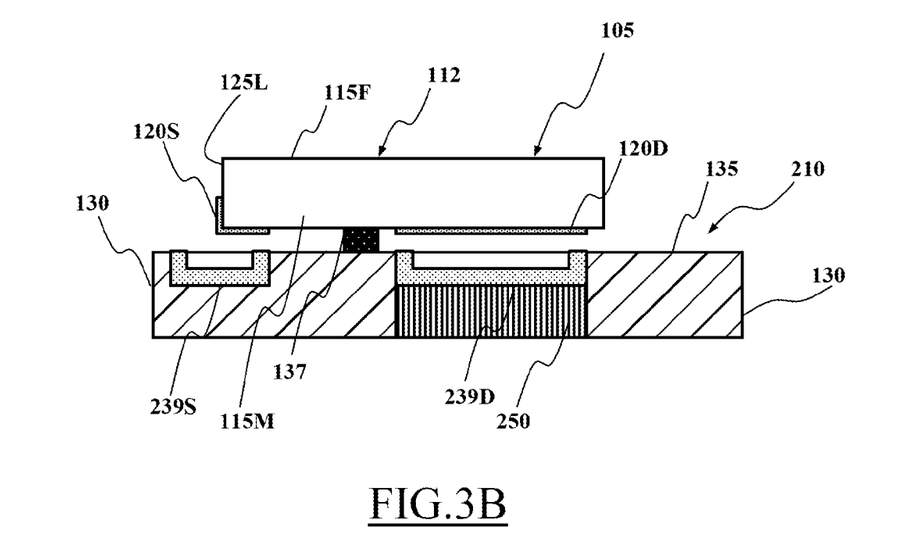
Figure 4:
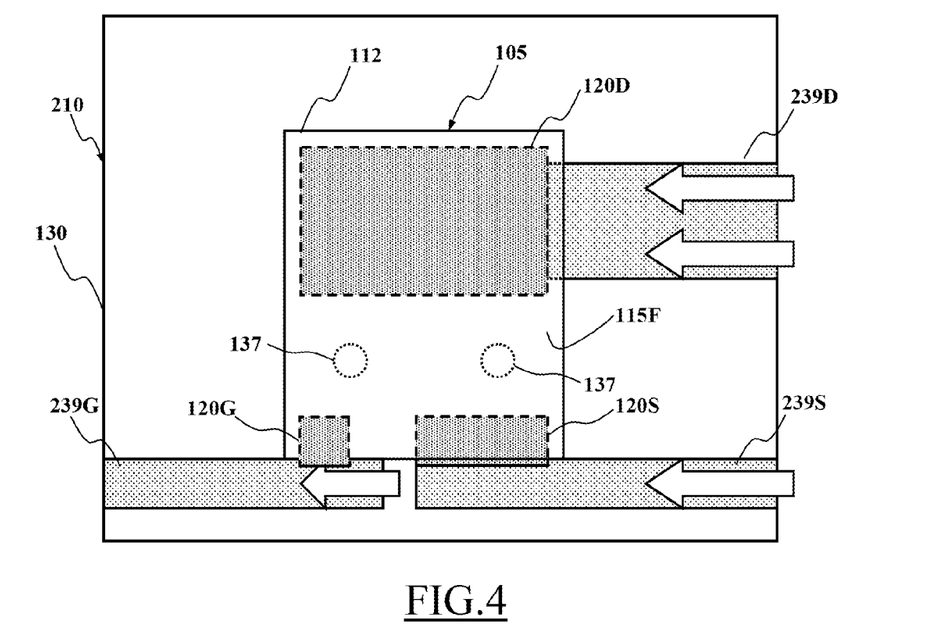
Figure 5:
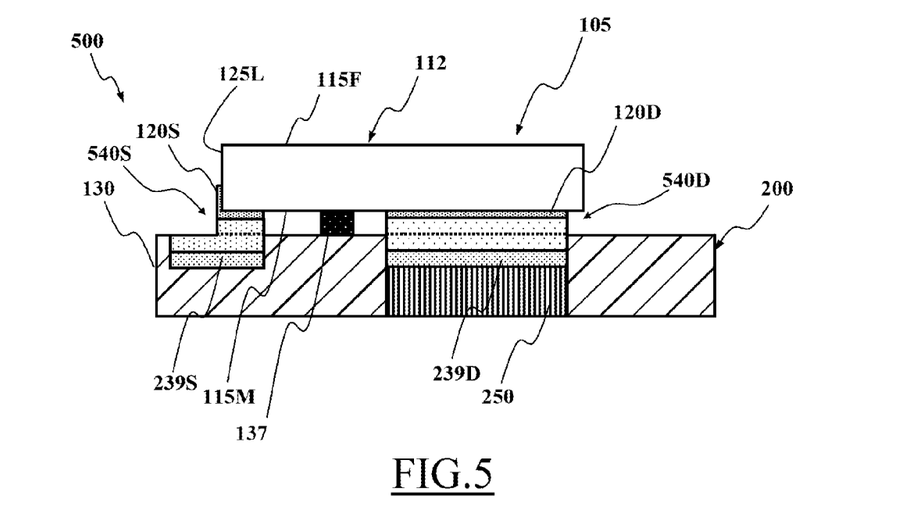

Turning now to the FIG. 3A, FIG. 3B, FIG. 4 and FIG. 5, they illustrate the various phases of a process for manufacturing an electronic system (indicated by the reference 500 in FIG. 5).

Starting from the FIGS. 3A-3B together, they illustrate a schematic plan view and a schematic cross-section side view with respect to the plan III-III, respectively, of a portion of an assembly comprising the electronic board 210 (see FIGS. 2A-2B) on which the electronic device 105, known per se (see FIGS. 1A-1B), is arranged.

In particular, such assembly is obtained by dispensing the adhesive paste 137 on the electronic board 210 in the two gluing sites (located between the pins 120S, 120G and the pin 120D). Subsequently, the electronic device 105 is positioned on the electronic board 210 (with its mounting surface 115M facing downwards), in such a way that the pins 120G, 120S and 120D are positioned above the enlarged portions of the traces 239G, 239S and 239D, respectively, of the electronic board 210. Consequently, the mounting surface 115M is attached to the adhesive paste 137, so that the electronic device 105 is temporarily bound to the electronic board 210 (with the pins 120G, 120S and 120D of the enlarged portions spaced apart from the traces 239G, 239S and 239D, respectively). In this case, however, the distance between the pins 120G, 120S and 120D and the enlarged portions of the traces 239G, 239S and 239D, respectively, is increased by the depth y of the tracks 239G,239S,239D.

Referring now to the FIG. 4, a schematic plan view is illustrated therein of the above described assembly while a wave of soldering paste floods the gluing surface 135 of the electronic board 210.

The wave of solder paste (conceptually shown with arrows in the figure) is canalized (or channeled) into the traces 239G, 239S, 239D thereby filling them. Thanks to the depth y of the traces 239G, 239S, 239D being formed sunken from the gluing surface 135 of the electronic board 210, the wave of soldering paste may reach every portion of the surfaces of the pins 120G, 120S, 120D of the electronic device 105 without substantially encountering any obstacles. In this way, the surfaces of the pins 120G, 120S, 120D may be reached in a sufficiently homogeneous manner even if their height on the gluing surface 135 of the electronic board 210 is reduced (e.g., in an assembly made with small quantities of adhesive paste 137), or if the mounting surface 115M of the electronic device 105 is not perfectly parallel to the gluing surface 135 of the electronic board 210 (e.g., because of the small number and the sub-optimal distribution of the gluing sites).

As shown in the schematic side view of FIG. 5, once cooled down the solder paste hardens and forms a gate track (not shown in the figure), a source track 540S and a drain track 540D, which create the desired electrical and mechanical coupling between the pin 120G, the pin 120S and the pin 120D, respectively, and the electronic board 210—in such a way to obtain the electronic system 500. Consequently, the coupling between the pins 120G, 120S, 120D and the tracks 540S, 540D is formed in a satisfactory way (both in mechanical and electrical terms)—even when the (STM "No-Lead" or "Micro-lead" type) electronic device 105 is small sized; this increases the performance and the useful life of the electronic system 500.

Figure 6A:
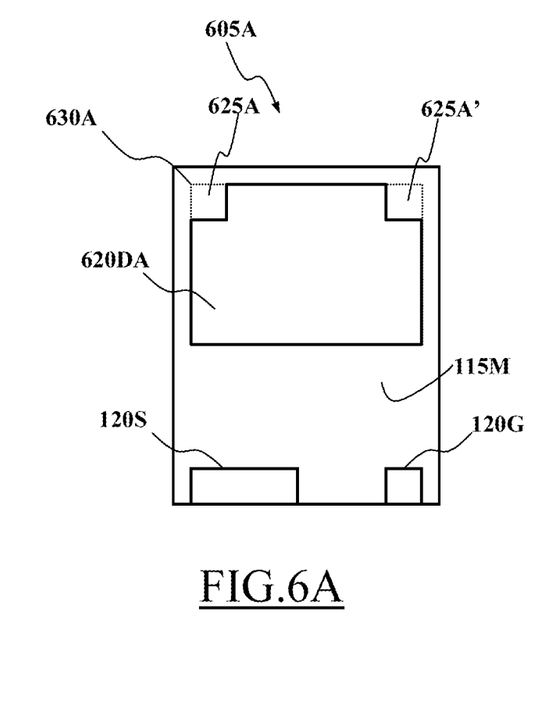
FIG. 6A illustrates a schematic plan view from below of an electronic device according to an embodiment.

Referring now to FIG. 6A, a schematic plan view from below is illustrated of an electronic device 605A according to an embodiment.

Particularly, the electronic device 605A differs from the (above described) electronic device known in the art as follows.

The drain pin, indicated by the reference 620DA (i.e., the largest pin that also operates as a heat sink) is modified in such a way to obtain at least one insulating window, such as the insulating windows 625A and 625A' in the example at issue, with respect to its rectangular footprint 630A (indicated by a dashed line). In more detail, the windows 625A and 625A' are defined by recesses that extend inward from a border of a rectangular footprint 630A. For example, the windows 625A and 625A may be formed by directly modifying the layout of the pin 620DA; alternatively, it is possible to form the windows 625A and 625A' by (chemically) etching the pin 620DA in a partial way (e.g., with a technique known as half-etching) and subsequently covering the areas being etched in this way with an insulating material (such as a resin).

The windows 625A and 625A' have such an extent such as to define corresponding gluing sites (for mounting the electronic device 605A on an electronic board, not shown). For example, the windows 625A and 625A' have an area equal to 1-5%, preferably equal to 2-4%, and even more preferably equal to 2.5-3.5%, for example, equal to 3% of the rectangular footprint 630A.

In this way, it is possible to have three or more gluing sites being not aligned with one another, thus able to define a geometric plane. Indeed, the two gluing sites defined by the windows 625A and 625A' are added to the gluing sites already available between the pins 120S,120G and the pin 620DA. Consequently, the electronic device 605A may be glued to the electronic board with the mounting surface 115M substantially parallel to the gluing surface thereof (as will be described in more detail below).

Figure 6B:
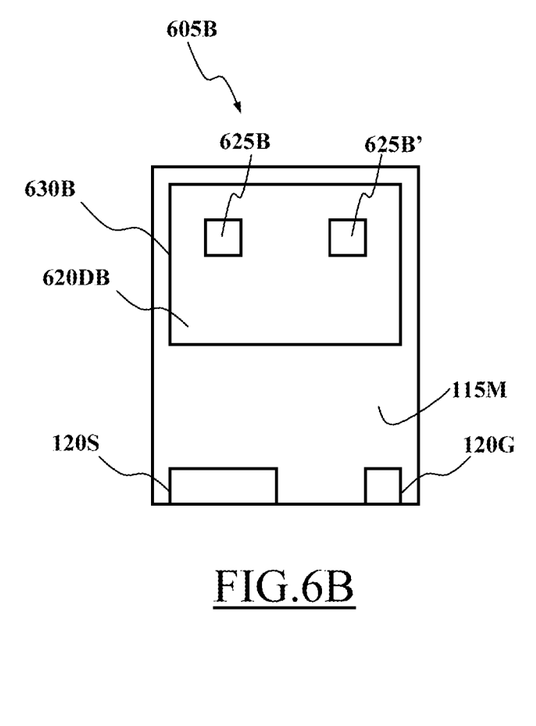
FIG. 6B illustrates a schematic plan view from below of an electronic device according to a further embodiment.

Turning now to FIG. 6B, a schematic plan view from below is illustrated of an electronic device 605B according to a further embodiment.

As above, the drain pin, indicated by the reference 620DB, is modified in such a way to obtain at least one insulating window, such as the insulating windows 625B and 625B' in the example at issue, with respect to its rectangular footprint 630B (defined by the contour of the pin 620DB). In this case, the windows 625B and 625B' are internal to the pin 620DB.

As above, it is thus possible to have three or more gluing sites non-aligned with one another (which allow gluing the electronic device 605B to the electronic board with the mounting surface 115M substantially parallel to the gluing surface thereof). In this case, moreover, the desired result is achieved without changing the (rectangular) contour of the pin 620DB.

Figure 7:
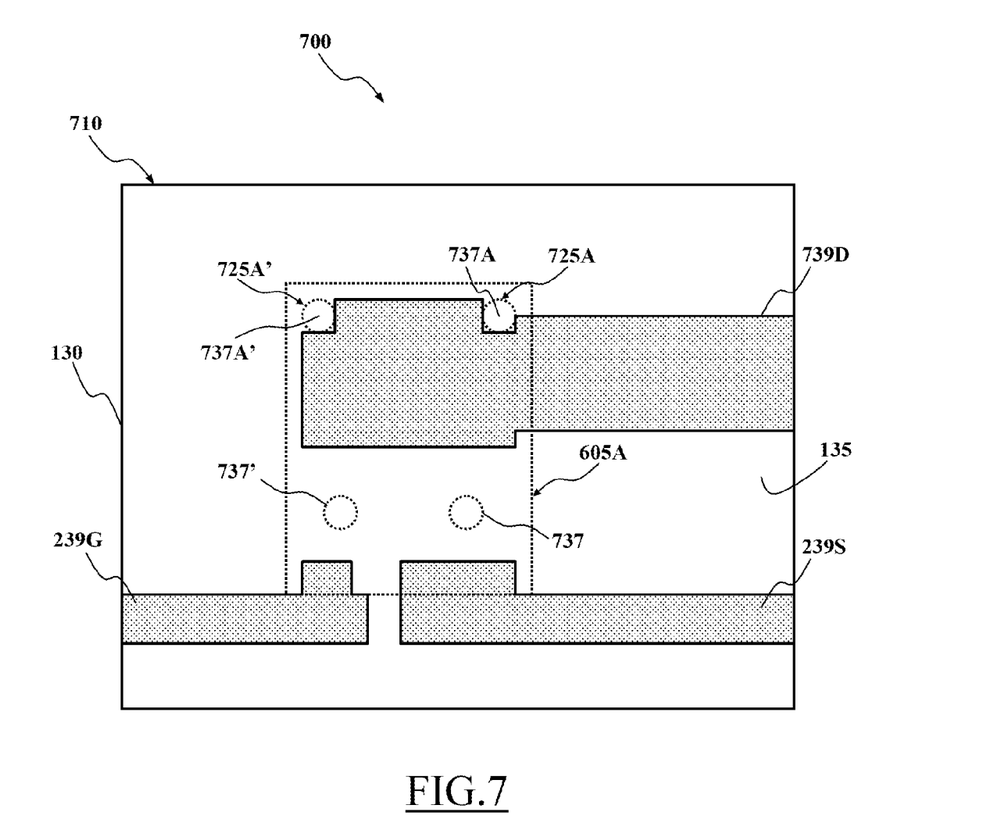
FIG. 7 illustrates a schematic plan view of an electronic system according to an embodiment.

Considering now FIG. 7, a schematic plan view is illustrated of an electronic system 700 according to an embodiment. In particular, the electronic system 700 comprises the electronic device 605A of FIG. 6A (shown in transparency in the figure), which is mounted on an electronic board 710.

The electronic board 710 differs from the electronic board as above described with respect to the FIGS. 2A and 2B as follows. The drain trace, indicated by the reference 739D, is modified in such a way to make further insulating windows 725A and 725A' on the gluing surface 135, at the windows of the electronic device 605A (with an extent being equal or greater than them). In more detail, the windows 725A and 725A' are defined by recesses that extend inward from an edge of the footprint of the track 739D (e.g., obtained by modifying the etching of the substrate 130 accordingly). In this way, on the gluing surface 135 four gluing sites (represented in dashed line) may be defined for dispensing the adhesive paste during the assembly of the electronic device 605A on the electronic board 710. In particular, two gluing sites 737 and 737' are defined between the traces 239G, 239S and the trace 739D (as in the known electronic boards); in addition, two gluing sites 737A and 737A' are defined by the windows 725A and 725A', respectively.

Figure 8:
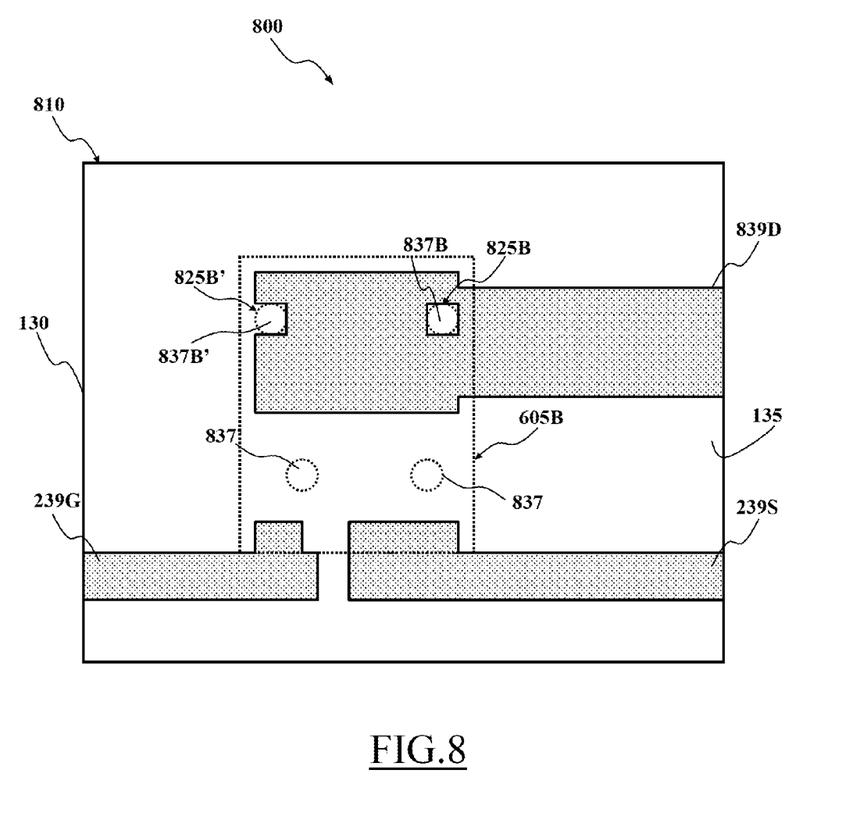
FIG. 8 illustrates a schematic plan view of an electronic system according to a further embodiment.

Turning to FIG. 8, a schematic plan view is illustrated of an electronic system 800 according to another embodiment. In particular, the electronic system 800 comprises the electronic device 605B of FIG. 6B (shown in transparency in the figure), which is mounted on an electronic board 810.

As above, the drain trace, indicated by the reference 839D, is modified in such a way to make further insulating windows 825B and 825B' on the gluing surface 135, at the windows of the electronic device 605B (with an extent being equal or greater than them). In more detail, the window 825B' is defined by a recess that extends inward from an edge of the footprint of the trace 839D, while the window 825B is placed within the trace 839D. For example, the windows 825B' and 825B are obtained by modifying the etching of the substrate 130 accordingly, in such a way to create a corresponding insulating protrusion that penetrates into the corresponding trace 839D and a corresponding pillar that rises from the bottom of the trace 839D, respectively. Again, on the gluing surface 135 four gluing sites (represented in dashed line) may be defined for dispensing the adhesive paste during the assembly of the electronic device 605B on the electronic board 810. In particular, two gluing sites 837 and 837' are defined between the traces 239G, 239S and the trace 739D (as in the known electronic boards); in addition, two gluing sites 837B and 837B' are defined by the windows 825B and 825B', respectively.

Figure 9:
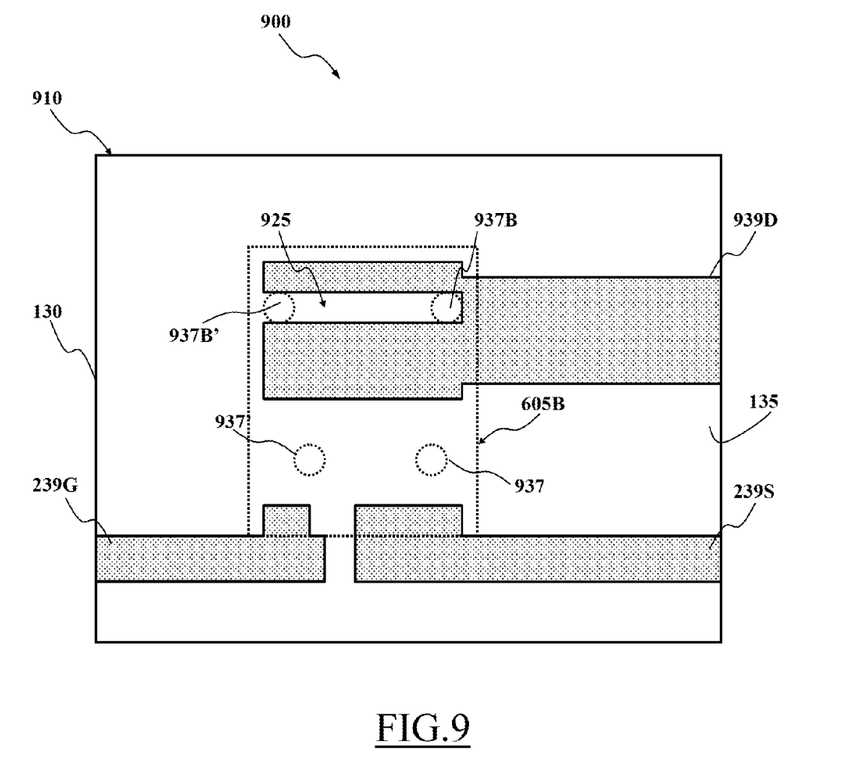
FIG. 9 illustrates a schematic plan view of an electronic system according to a still further embodiment.

With reference at the end to FIG. 9, a schematic plan view is illustrated of an electronic system 900 according to a still further embodiment. In particular, the electronic system 900 again comprises the electronic device 605B of FIG. 6B (shown in transparency in the figure), which is mounted on a different electronic board 910.

In this case, the drain trace, indicated by the reference 939D, is modified in such a way to make one further insulating window 925 only on the gluing surface 135, at both the windows of the electronic device 605B. In more detail, the window 925 is defined by a recess that extends inward from one edge of the footprint of the trace 939D up to reach positions corresponding to both the windows of the electronic device 605B. For example, the window 925 is obtained by modifying the etching of the substrate 130, such as to create an insulating wall that penetrates inside the trace 939D. In this case as well, four gluing sites (represented in dashed line) may be defined on the gluing surface 135 for dispensing the adhesive paste during the assembly of the electronic device 605B on the electronic board 810. In particular, two gluing sites 937 and 937' are defined between the traces 239G, 239S and the trace 739D (as in the known electronic boards); in addition, two gluing sites 937B and 937B' are defined in the window 925.

In all the above described cases (with reference to the FIGS. 7-9), this allows gluing the electronic device on the electronic board with its mounting surface substantially parallel to the gluing surface, thanks to the fact that the four gluing sites define a geometric supporting plane thereof (in addition to the fact that the sunken traces ensure that, during the wave soldering, the solder paste is able to reach every portion of the pins of the electronic device).

Naturally, in order to satisfy local and specific requirements, a person skilled in the art may apply to the solution above described many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, the terms including, comprising, having and containing (and any of their forms) should be understood with an open and non-exhaustive meaning (i.e., not limited to the recited elements), the terms based on, dependent from, according to, function of (and any of their forms) should be understood with a non-exclusive relationship (i.e., with possible further variables involved) and the term a should be understood as one or more elements (unless expressly stated otherwise).

For example, an embodiment provides an electronic board (for mounting a set of one or more surface mounting technology electronic devices). Similar considerations apply if the electronic board has a different structure or comprises equivalent components (e.g., also not of the PCB type), or it has other characteristics. In any case, any component may be separated into several elements, or two or more components may be combined into a single element; moreover, each component may be replicated for supporting the execution of the corresponding operations in parallel. It should also be noted that (unless stated otherwise) any interaction between different components usually needs not to be continuous, and may be both direct and indirect through one or more intermediaries.

The electronic board comprises an insulating substrate for supporting the electronic devices (made in any other manner—e.g., of other materials or multilayer); the insulating substrate has a gluing surface for gluing the electronic devices. The electronic board also comprises a set of (one or more) conducting traces, which are adapted to form, during a wave soldering operation of the electronic devices, corresponding conducting tracks electrically contacting the electronic devices (with any shape and/or size).

In the solution according to an embodiment, each conducting trace is sunken (at least in part) in the substrate with respect to the gluing surface (with any other depth).

In an embodiment, each trace is completely sunken in the substrate with respect to the gluing surface; alternatively, the trace may be sunken in a different way (e.g., with variable depths or even at the pad for the pins only).

Another embodiment proposes a process for manufacturing an electronic system by mounting a set of (one or more) surface mounting technology electronic devices on an electronic board. The process comprises the step of gluing the electronic devices onto a gluing surface of an insulating substrate of the electronic board adapted to support the electronic devices (with any suitable material). The process prosecutes by wave-soldering the electronic devices to the electronic board; this involves the formation, from a set of conducting traces of the electronic board, of corresponding conducting tracks electrically contacting the electronic devices. In the solution according to an embodiment, each conducting trace is at least partially sunken in the substrate with respect to the gluing surface.

Similar considerations apply if the same solution is implemented with an equivalent process (using similar steps with the same functions of more steps or portions thereof, removing some unessential steps, or adding further optional steps); moreover, the steps may be performed in different order, in parallel or overlapped (at least in part).

Another embodiment provides a surface mounting technology electronic device. In this case as well, similar considerations apply if the electronic device has a different structure or comprises equivalent components (e.g., also not of the "No-Lead" or "Micro-lead" type), or it has other working characteristics. In any case, any component thereof may be separated into more elements, or two or more components may be combined into a single element; in addition, each component may be replicated for supporting the execution of the corresponding operations in parallel. It should also be noted that (unless stated otherwise) any interaction between different components usually needs not to be continuous, and may be both direct and indirect through one or more intermediaries.

The electronic device comprises an insulating body (of any material and/or shape) for enclosing at least one chip (or more) in which at least one electronic component (or more) is integrated; the insulating body has a mounting surface for mounting the electronic device on an electronic board. A set of conducting pins (of any material and/or form) is exposed at least partly on the mounting surface to be soldered to corresponding conducting tracks of the electronic board.

In the solution according to an embodiment, a set of (one or more) insulating windows (of any form and/or size) are provided on the mounting surface within a rectangular footprint of at least one of the pins; each one of such windows defines a corresponding gluing site of the electronic device on the electronic board.

In an embodiment, at least one of the windows is defined by a recess of the pin that extends inward from said rectangular footprint; in addition or in alternative, at least one of the windows is internal to the pin. In any case, the windows of each pin may be combined in any manner (e.g., all recess-based, all internal, or of both types).

In an embodiment, the area of each window is equal to 1-5% of the area of the pin (even if different extents are not completely excluded).

In an embodiment, the pin comprises a heat sink (with said at least one chip that is mounted on the heat sink). In any case, the same solution may also be applied to any other pin (even if it does not operate as heat sink).

Another embodiment provides an electronic system comprising an electronic board (which has an insulating substrate with a gluing surface and a set of conducting tracks) and at least one electronic device as set out above (which is mounted on the electronic board); each electronic device has at least three gluing sites non-aligned with one another (comprising said windows), which are glued on the gluing surface, and it has the pins soldered to the tracks. For example, the gluing sites may all consist of the above-mentioned windows, or they may comprise one or more other portions of the mounting surface (external to the footprint of the pins).

In an embodiment, the electronic board is made as set out above; in any case, the application of the same solution to any other electronic board (also of the standard type) is not excluded.

In an embodiment, the gluing sites comprise a pair of gluing sites; the corresponding track comprises a further insulating window that extends between positions corresponding to the pair of gluing sites. In any case, the track may have any other configuration (e.g., simply with windows corresponding to those of the electronic device).

It is apparent that the proposed electronic board and the electronic devices may be made and marketed as separate products. In contrast, the proposed electronic board, electronic devices and electronic system may be coupled with one or more other components, or they may be assembled into intermediate products (such as motherboards); in any case, such components are adapted to be used in complex structures (such as mobile phones).

What is claimed is:

1. An apparatus, comprising an electronic board configured to mount a surface mounting technology electronic device, wherein the electronic board comprises:
    an insulating substrate including a mounting region configured to support mounting of the surface mounting technology electronic device, the insulating substrate having a gluing surface, and
    a set of conducting traces configured to form, during a wave soldering operation of the surface mounting technology electronic device, corresponding conducting tracks electrically contacting the surface mounting technology electronic device, wherein each conducting trace comprises a channel having a width and a length which exceeds the width, wherein the length of the channel extends from within the mounting region to outside of the mounting region in order to enable solder paste to flow along the length of the channel during the wave soldering operation to form the respective conducting tracks,
    wherein each conducting trace has an upper surface that is at least partially sunken in the substrate with respect to the gluing surface, the upper surface forming a bottom surface of the respective channel.

2. The apparatus according to claim 1, wherein each conducting trace is completely sunken in the insulating substrate with respect to the gluing surface.

3. The apparatus of claim 1, further comprising a surface mounting technology electronic device mounted to said electronic board at the mounting region, the electronic device comprising:
    an insulating body enclosing at least one chip in which at least one electronic component is integrated, the insulating body having a mounting surface for mounting the surface mounting technology electronic device on said electronic board,
    a set of conducting pins at least partially exposed on the mounting surface to be soldered to corresponding conducting tracks of the electronic board,
    a set of insulating windows, each window defining a corresponding gluing site of the electronic device to the gluing surface on the electronic board, provided on the mounting surface within a rectangular footprint of at least one of the pins.

4. The apparatus according to claim 3, wherein at least one of the insulating windows is defined by a recess of the pin extending inward from said rectangular footprint.

5. The apparatus according to claim 3, wherein at least one of the insulating windows is internal to the pin.

6. The apparatus according to claim 3, wherein the area of each insulating window is equal to 1-5% of the area of the pin.

7. The apparatus according to claim 3, wherein the pin comprises a heat sink, said at least one chip being mounted on the heat sink.

8. An apparatus, comprising:
    an insulating substrate having a gluing surface,
    a set of conducting traces configured to form corresponding conducting tracks, and
    a surface mounting technology electronic device mounted to the insulating substrate, the surface mounting technology electronic device comprising:
        an insulating body enclosing at least one chip in which at least one electronic component is integrated, the insulating body having a mounting surface for mounting the surface mounting technology electronic device on the electronic board,
        a set of conducting pins at least partially exposed on the mounting surface to be soldered to corresponding conducting tracks of the electronic board, and
        an insulating window defining a corresponding gluing site of the surface mounting technology electronic device to the gluing surface on the electronic board, provided on the mounting surface at a footprint of at least one of the pins.

9. The apparatus of claim 8, wherein the insulating window is provided on the mounting surface at the perimeter of the footprint of at least one of the pins.

10. The apparatus of claim 8, wherein the insulating window is provided on the mounting surface within the footprint of at least one of the pins.

11. The apparatus of claim 8, wherein the footprint of at least one of the pins has a rectangular shape.

12. The apparatus of claim 8, wherein the surface mounting technology electronic device is temporarily glued to the gluing surface of the electronic board using a gluing paste at the insulating window before undergoing wave soldering.

13. The apparatus of claim 8, wherein each of the set of conducting traces further includes a channel configured to enable solder paste to flow through in the wave soldering operation to form the respective conducting tracks during wave soldering.

14. The apparatus of claim 13, wherein the upper surface of the conducting trace is the bottom surface of the respective channel.

15. An apparatus, comprising:
   a surface mounting technology electronic device having a mounting surface with at least one conductive pad and a peripheral edge; and
   an electronic board comprising:
      an insulating substrate having a top surface including a mounting region to which the mounting surface of the surface mounting technology electronic device is attached, and
      a conducting track extending along the top surface of the insulating substrate, wherein the conducting track comprises:
         a channel having a width and a length which exceeds the width, wherein the length of the channel extends from underneath the attached surface mounting technology electronic device at said at least one conductive pad to beyond the peripheral edge of the surface mounting technology electronic device mounted at the mounting region;
         wherein the channel has a bottom surface with a sunken offset from the top surface of the insulating substrate; and
         solder material from wave soldering which flowed along the length of and filled the channel to make an electrical connection to said at least one conductive pad of the surface mounting technology electronic device.

* * * * *